United States Patent
Heineck et al.

(10) Patent No.: US 9,337,201 B2
(45) Date of Patent: May 10, 2016

(54) MEMORY CELLS, ARRAYS OF MEMORY CELLS, AND METHODS OF FORMING MEMORY CELLS

(75) Inventors: Lars Heineck, Garden City, ID (US); Jaydip Guha, Boise, ID (US)

(73) Assignee: Micron Technology, Inc., Boise, ID (US)

(*) Notice: Subject to any disclaimer, the term of this patent is extended or adjusted under 35 U.S.C. 154(b) by 303 days.

(21) Appl. No.: 13/612,507

(22) Filed: Sep. 12, 2012

(65) Prior Publication Data
US 2013/0001666 A1 Jan. 3, 2013

Related U.S. Application Data

(62) Division of application No. 12/917,346, filed on Nov. 1, 2010, now Pat. No. 8,361,856.

(51) Int. Cl.
*H01L 27/088* (2006.01)
*H01L 27/108* (2006.01)

(52) U.S. Cl.
CPC .... *H01L 27/10876* (2013.01); *H01L 27/10823* (2013.01); *H01L 27/10882* (2013.01); *H01L 27/10885* (2013.01); *H01L 27/10888* (2013.01)

(58) Field of Classification Search
CPC .............. H01L 27/10885; H01L 27/10888
See application file for complete search history.

(56) References Cited

U.S. PATENT DOCUMENTS

| | | |
|---|---|---|
| 3,562,022 A | 2/1971 | Shifrin |
| 3,865,624 A | 2/1975 | Wilde |
| 4,673,962 A | 6/1987 | Chatterjee et al. |
| 4,764,394 A | 8/1988 | Conrad |
| 4,829,018 A * | 5/1989 | Wahlstrom .......... H01L 21/8221 148/DIG. 135 |
| 4,920,390 A | 4/1990 | Fuse et al. |
| 5,374,456 A | 12/1994 | Matossian et al. |
| 5,508,212 A | 4/1996 | Wang et al. |
| 5,627,390 A | 5/1997 | Maeda et al. |

(Continued)

FOREIGN PATENT DOCUMENTS

| | | |
|---|---|---|
| KR | 10-2004-0055142 | 6/2004 |
| TW | 200540924 | 12/2005 |

(Continued)

OTHER PUBLICATIONS

U.S. Appl. No. 12/917,346, filed Nov. 1, 2010, Heineck et al.

(Continued)

*Primary Examiner* — Matthew W Such
*Assistant Examiner* — Abul Kalam
(74) *Attorney, Agent, or Firm* — Wells St. John, P.S.

(57) ABSTRACT

A memory cell includes a vertically oriented transistor having an elevationally outer source/drain region, an elevationally inner source/drain region, and a channel region elevationally between the inner and outer source/drain regions. The inner source/drain region has opposing laterally outer sides. One of a pair of data/sense lines is electrically coupled to and against one of the outer sides of the inner source/drain region. The other of the pair of data/sense lines is electrically coupled to and against the other of the outer sides of the inner source/drain region. An access gate line is elevationally outward of the pair of electrically coupled data/sense lines and is operatively adjacent the channel region. A charge storage device is electrically coupled to the outer source/drain region. Other embodiments and additional aspects, including methods, are disclosed.

38 Claims, 12 Drawing Sheets

(56) References Cited

U.S. PATENT DOCUMENTS

| | | |
|---|---|---|
| 5,672,541 A | 9/1997 | Booske et al. |
| 5,828,094 A | 10/1998 | Lee |
| 5,897,363 A | 4/1999 | Gonzalez et al. |
| 6,137,713 A | 10/2000 | Kuroda et al. |
| 6,221,724 B1 | 4/2001 | Yu et al. |
| 6,225,151 B1 | 5/2001 | Gardner et al. |
| 6,329,686 B1 | 12/2001 | Lowrey et al. |
| 6,417,040 B2 | 7/2002 | Noble |
| 6,492,245 B1 | 12/2002 | Liu et al. |
| 6,504,201 B1 | 1/2003 | Noble et al. |
| 6,563,162 B2 | 5/2003 | Han et al. |
| 6,582,998 B2 | 6/2003 | Nitta |
| 6,593,612 B2 | 7/2003 | Gruening et al. |
| 6,600,191 B2 | 7/2003 | Lowrey et al. |
| 6,639,846 B2 | 10/2003 | Nikutta |
| 6,689,660 B1 | 2/2004 | Noble et al. |
| 6,716,727 B2 | 4/2004 | Walther |
| 6,977,417 B2 | 12/2005 | Momiyama et al. |
| 6,992,349 B2 | 1/2006 | Lee et al. |
| 7,012,021 B2 | 3/2006 | Ang et al. |
| 7,015,091 B1 | 3/2006 | Wu |
| 7,052,941 B2 | 5/2006 | Lee |
| 7,074,656 B2 | 7/2006 | Yeo et al. |
| 7,099,174 B2 | 8/2006 | Thompson et al. |
| 7,129,538 B2 | 10/2006 | Lee at al. |
| 7,166,479 B2 | 1/2007 | Zhu et al. |
| 7,179,703 B2 | 2/2007 | Gonzalez et al. |
| 7,365,384 B2 | 4/2008 | Tran et al. |
| 7,456,068 B2 | 11/2008 | Kavalieros et al. |
| 7,491,641 B2 | 2/2009 | Southwick et al. |
| 7,501,676 B2 | 3/2009 | Doyle |
| 7,518,182 B2 | 4/2009 | Abbott et al. |
| 7,592,212 B2 | 9/2009 | Qin et al. |
| 7,713,823 B2 | 5/2010 | Sung et al. |
| 7,736,969 B2 | 6/2010 | Abbott at al. |
| 7,737,010 B2 | 6/2010 | Qin et al. |
| 7,768,073 B2 | 8/2010 | Wells |
| 7,939,409 B2 | 5/2011 | Figura et al. |
| 7,948,064 B2 | 5/2011 | Barth et al. |
| 7,956,402 B2 | 6/2011 | Chen et al. |
| 8,008,158 B2 | 8/2011 | Chang et al. |
| 8,202,781 B2 | 6/2012 | Kim |
| 2002/0110039 A1 | 8/2002 | Forbes et al. |
| 2003/0096490 A1 | 5/2003 | Borland et al. |
| 2003/0107911 A1 | 6/2003 | Nishihara et al. |
| 2003/0186519 A1 | 10/2003 | Downey et al. |
| 2004/0195594 A1 | 10/2004 | Tran et al. |
| 2005/0017281 A1 | 1/2005 | Lowrey |
| 2005/0079721 A1 | 4/2005 | Buerger, Jr. et al. |
| 2005/0260838 A1 | 11/2005 | Downey et al. |
| 2006/0017088 A1 | 1/2006 | Abbott et al. |
| 2006/0043617 A1* | 3/2006 | Abbott .............. H01L 27/10885 257/427 |
| 2006/0059449 A1 | 3/2006 | Yang et al. |
| 2006/0081884 A1 | 4/2006 | Abbott et al. |
| 2006/0249770 A1 | 11/2006 | Huo et al. |
| 2007/0087574 A1 | 4/2007 | Gupta et al. |
| 2007/0171742 A1 | 7/2007 | Yi |
| 2007/0243680 A1 | 10/2007 | Harari et al. |
| 2007/0246783 A1 | 10/2007 | Moon et al. |
| 2007/0295995 A1* | 12/2007 | Yun et al. ....................... 257/202 |
| 2008/0142931 A1 | 6/2008 | Sasaki et al. |
| 2008/0217655 A1 | 9/2008 | Baumann et al. |
| 2008/0266628 A1 | 10/2008 | Brown et al. |
| 2008/0277738 A1 | 11/2008 | Ananthan |
| 2009/0121268 A1 | 5/2009 | Lee et al. |
| 2009/0230466 A1* | 9/2009 | Kim ............................. 257/331 |
| 2009/0256187 A1 | 10/2009 | Kim |
| 2010/0038709 A1 | 2/2010 | Wang et al. |
| 2010/0237423 A1 | 9/2010 | Yun et al. |
| 2011/0019486 A1 | 1/2011 | Jang et al. |
| 2011/0215391 A1 | 9/2011 | Takaishi |
| 2011/0215408 A1 | 9/2011 | Tang et al. |
| 2011/0220994 A1 | 9/2011 | Parekh et al. |
| 2012/0104491 A1 | 5/2012 | Heineck et al. |
| 2013/0168757 A1 | 7/2013 | Hong |

FOREIGN PATENT DOCUMENTS

| | | |
|---|---|---|
| TW | 102127877 | 4/2015 |
| WO | PCT/US2013/051662 | 11/2013 |
| WO | PCT/US2013/051662 | 3/2015 |

OTHER PUBLICATIONS

U.S. Appl. No. 13/031,829, filed Feb. 22, 2011, Guha et al.

Bernstein et al., Effects of Dopant Deposition on p+/n and n+/p Shallow Junctions formed by Plasma Immersion Ion Implantation, IEEE, 2000, 464-467.

Gras-Marti, "Recoil Implanatation Yields and Depth Profiles", Phys. Stat. Sol. (1) 76, 621-627, 1983.

Oh et al., "Characterization of $B_2H_6$ Plasma Doping for Converted p+ Poly-Si Gate", 2006 American Institute of Physics, pp. 25-28.

Qin et al., "Comparative Study of Self-Sputtering Effects of Different Boron-Based Low-Energy Doping Techniques", 2009 IEEE, vol. 37, No. 9, Sep. 2009, pp. 1760-1766.

Dopant Diffusion in C-Doped and Si and SiGe: Physical Model and Experimental Verification; Rucker et al.; Institute for Semiconductor Physics; 1999; 4 pp.

* cited by examiner

MEMORY CELLS, ARRAYS OF MEMORY CELLS, AND METHODS OF FORMING MEMORY CELLS

RELATED PATENT DATA

This patent resulted from a divisional application of U.S. patent application Ser. No. 12/917,346, filed Nov. 1, 2010, entitled "Memory Cells, Arrays Of Memory Cells, And Methods Of Forming Memory Cells", naming Lars P. Heineck and Jaydip Guha as inventors, the disclosure of which is incorporated by reference.

TECHNICAL FIELD

Embodiments disclosed herein pertain to memory cells and to methods of forming memory cells.

BACKGROUND

Memory is one type of integrated circuitry, and is used in computer systems for storing data. Such is usually fabricated in one or more arrays of individual memory cells. The memory cells might be volatile, semivolatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

DETAILED DESCRIPTION OF EXAMPLE EMBODIMENTS

Figure 1:
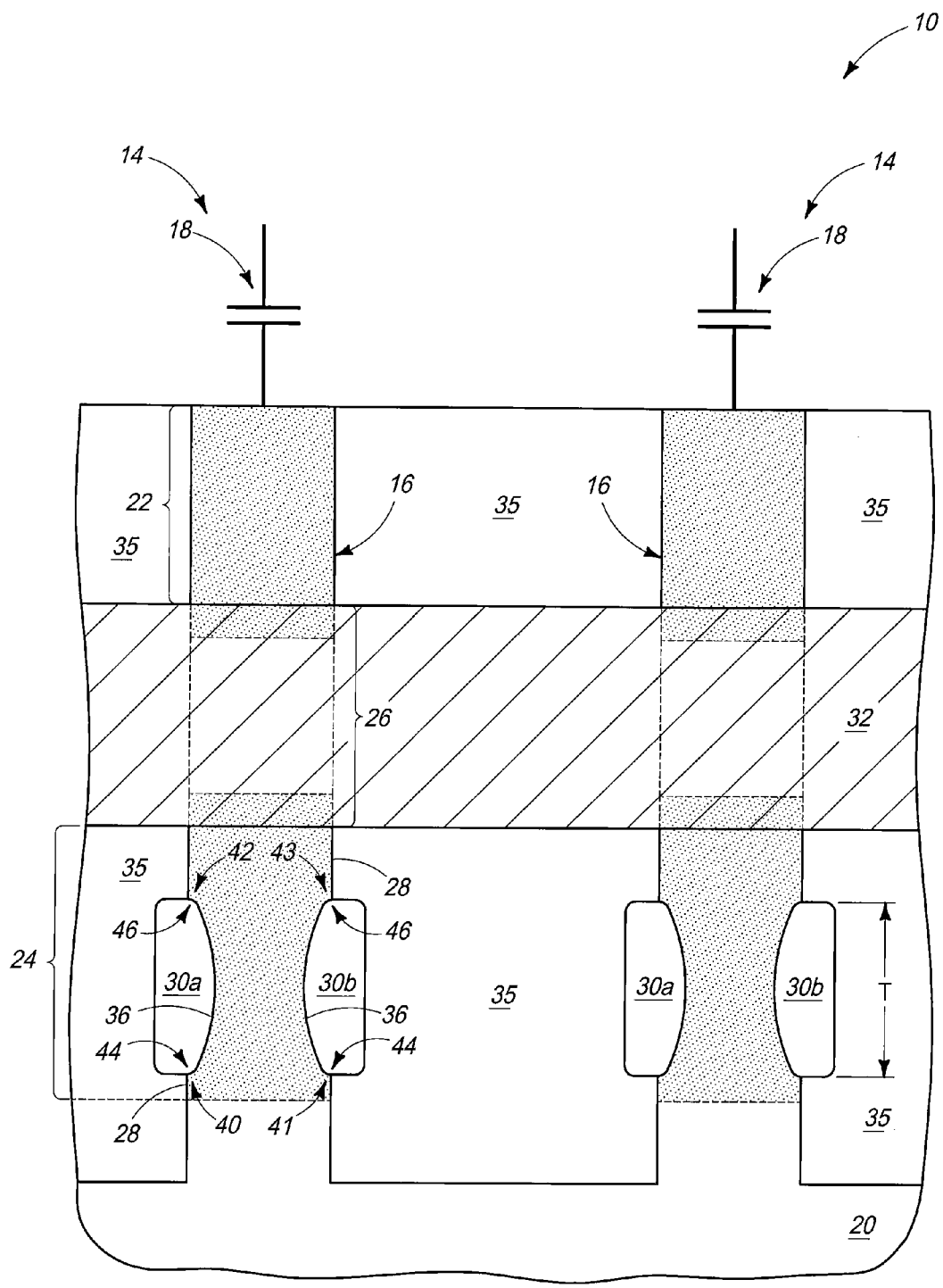
FIG. 1 is a hybrid schematic and fragmentary structural view of a portion of an integrated circuit in accordance with an embodiment of the invention.
Figure 2:
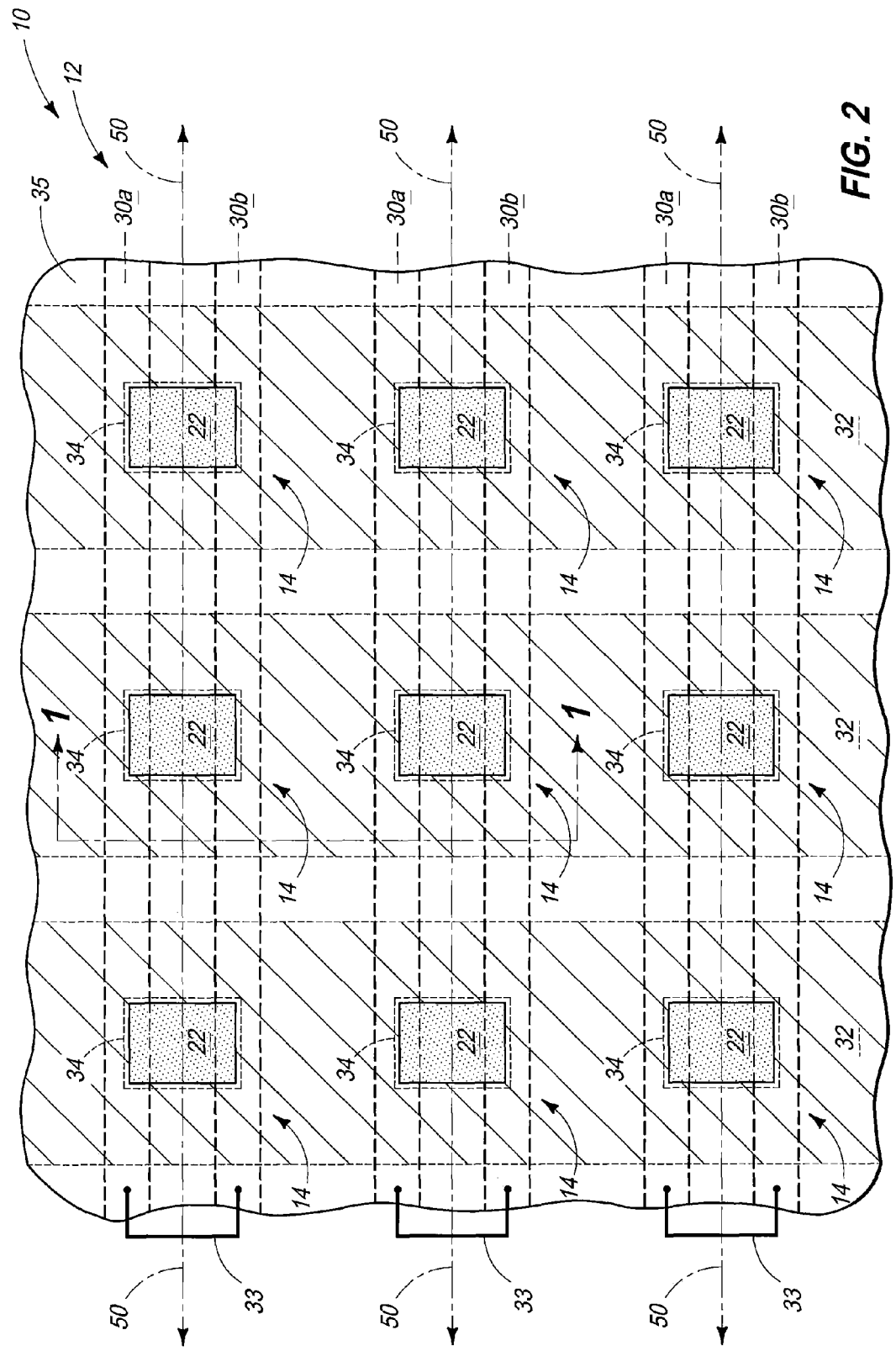
FIG. 2 is a diagrammatic top plan view of an array of memory cells in accordance with an embodiment of the invention, with FIG. 1 comprising a sectional view of FIG. 2 taken through line 1-1.

Embodiments of the invention encompass memory cells, arrays of memory cells, and methods of forming memory cells and arrays of memory cells. An example embodiment of an array of memory cells is described initially with reference to FIGS. 1 and 2. Such comprises a substrate fragment 10, for example a semiconductor substrate, having a memory array circuitry area 12 (FIG. 2). In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, semiconductive substrates. Memory array area 12 comprises a plurality of individual memory cells 14 which include a generally vertically oriented transistor 16 and charge storage device 18 (not shown in FIG. 2). In one embodiment, the depicted circuitry may be configured as Dynamic Random Access Memory (DRAM). Charge storage device 18 is depicted schematically as being a capacitor, although other existing or yet-to-be developed devices may be used.

In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further in this document, "elevational" and "elevationally" are with reference to the vertical direction relative to a base substrate upon which the circuitry is fabricated.

Substrate fragment 10 comprises substrate material 20 elevationally outward of and/or partially from which transistor 16 and charge storage devices 18 may be fabricated. Substrate material 20 may be homogenous or non-homogenous, and may comprise multiple different composition layers and/or materials. Example materials include semiconductive material, for example bulk monocrystalline silicon lightly background doped with a p-type conductivity modifying impurity.

Transistors 16 individually have an elevationally outer source/drain region 22, an elevationally inner source/drain region 24, and a channel region 26 received elevationally between inner source/drain region 24 and outer source/drain region 22. Each may be homogenous or non-homogenous, with suitably doped semiconductive material (i.e., monocrystalline silicon) being examples. Specifically, inner and outer source/drain regions 24, 22, respectively, may comprise highest-dopant concentration portions which are suitably conductively doped with p or n-type conductivity modifying impurity, wherein channel region 26 may be doped with a lower concentration of the other of p or n-type impurity. Regardless, charge storage devices 18 may electrically couple to outer source/drain region 22. In the context of this document, devices or components are electrically coupled relative one another if electric current continuously flows from one to the other predominantly by movement of subatomic positive and/or negative charges when such are generated as opposed to predominantly by movement of ions. For purposes of the continuing discussion, inner source/drain region 24 may be considered as having opposing laterally outer sides 28.

Memory array 12 comprises an array of immediately adjacent pairs of electrically coupled data/sense lines 30a, 30b on opposite lateral sides of source/drain region 24. Data/sense lines 30a and 30b of an individual pair of such data/sense lines are electrically coupled to one another other than solely through source/drain region 22. Such are not shown as being so electrically coupled in the FIG. 1 partial substrate construction view, yet are shown schematically in FIG. 2 as being electrically coupled to one another via respective interconnects 33. Such may be so coupled outside of the FIG. 2 view within the array and/or peripherally of the array. For example, data/sense lines 30a, 30b of an individual pair might be electrically coupled at or adjacent longitudinal ends thereof by a metal interconnect. One of data/sense lines 30a or 30b of the individual pairs of such lines is electrically coupled to and against one of outer sides 28 of inner source/drain region 24 of individual memory cells 14, with the other of such lines 30a or 30b of the individual pairs being electrically coupled to and against the other of outer sides 28 of inner source/drain region 24 of individual memory cells 14. Data/sense line pairs 30a, 30b may be homogenous or non-homogenous. Example materials include elemental metals, alloys of elemental metals, conductive metal compounds, and/or conductively doped semiconductive material.

An array of access gate lines 32 is provided elevationally outward of the array of data/sense line pairs 30a, 30b. Such are received operatively adjacent channel region 26 of individual memory cells 14, with a gate dielectric 34 (FIG. 2) being provided laterally between individual access gate lines 32 and respective channel portions 26. Dielectric material 35 is shown as surrounding transistors 16 and date/sense lines 30a, 30b. Such may be homogenous or non-homogenous, with silicon nitride and boron and/or phosphorus doped silicon dioxide being examples. Access gate lines 32 in FIG. 2 are shown with diagonal hatching for distinguishing clarity in FIG. 2, although such would be received within dielectric material 35 as shown in FIG. 1.

Data/sense lines 30a, 30b may be of the same size, shape, and/or configuration, or be of different respective sizes, shapes, and/or configurations. In one embodiment, outer sides 28 of inner source/drain region 24 respectively have a curved surface 36 against which the one or other data/sense lines 30a, 30b is received, with such curved surface 36 in one embodiment as shown being concave. In one embodiment, data/sense lines 30a, 30b of a respective pair have a common (the same) elevational thickness "T", and in one embodiment as shown with such elevational thicknesses T being elevationally coincident relative one another. Inner source/drain region 24 may be elevationally thicker than at least one or both of data/sense lines 30a, 30b.

In some embodiments, the inner source/drain region extends elevationally inward and/or outward relative to one or both of the data/sense lines. In FIG. 1, inner source/drain region 24 extends elevationally inward and outward relative to both data/sense lines 30a, 30b. Inner source/drain region 24 may include a first portion 40 received elevationally inward of a first portion 44 of one data/sense line (i.e., line 30a) and a second portion 41 received elevationally inward of a first portion 44 of the other data/sense line (i.e., line 30b). Inner source/drain region 24 may include a third portion 42 received elevationally outward of a second portion 46 of the one data/sense line (i.e., line 30a) and a fourth portion 43 received elevationally outward of a second portion 46 of the other data/sense line (line 30b).

Memory cells 14 of memory array 12 may be considered as extending along respective lines 50 which run parallel data/sense line 30a, 30b of a pair of such lines. Material of inner source/drain regions 24 of individual memory cells 14 may electrically couple with the inner source/drain regions of other memory cells respectively extending along a given line 50 of such memory cells. For example and by way of example only, inner source/drain regions 24 may be formed as a continuously doped region of semiconductive material 20 along the respective lines 50. Alternately in one embodiment, inner source/drain regions 24 of individual memory cells 14 may be electrically isolated from the inner source/drain regions of the other memory cells which respectively extend along lines 50 of such memory cells. For example, each inner source/drain region 24 may be an isolated/spaced conductively doped region of semiconductive material 20 along the respective lines 50.

Figure 3:
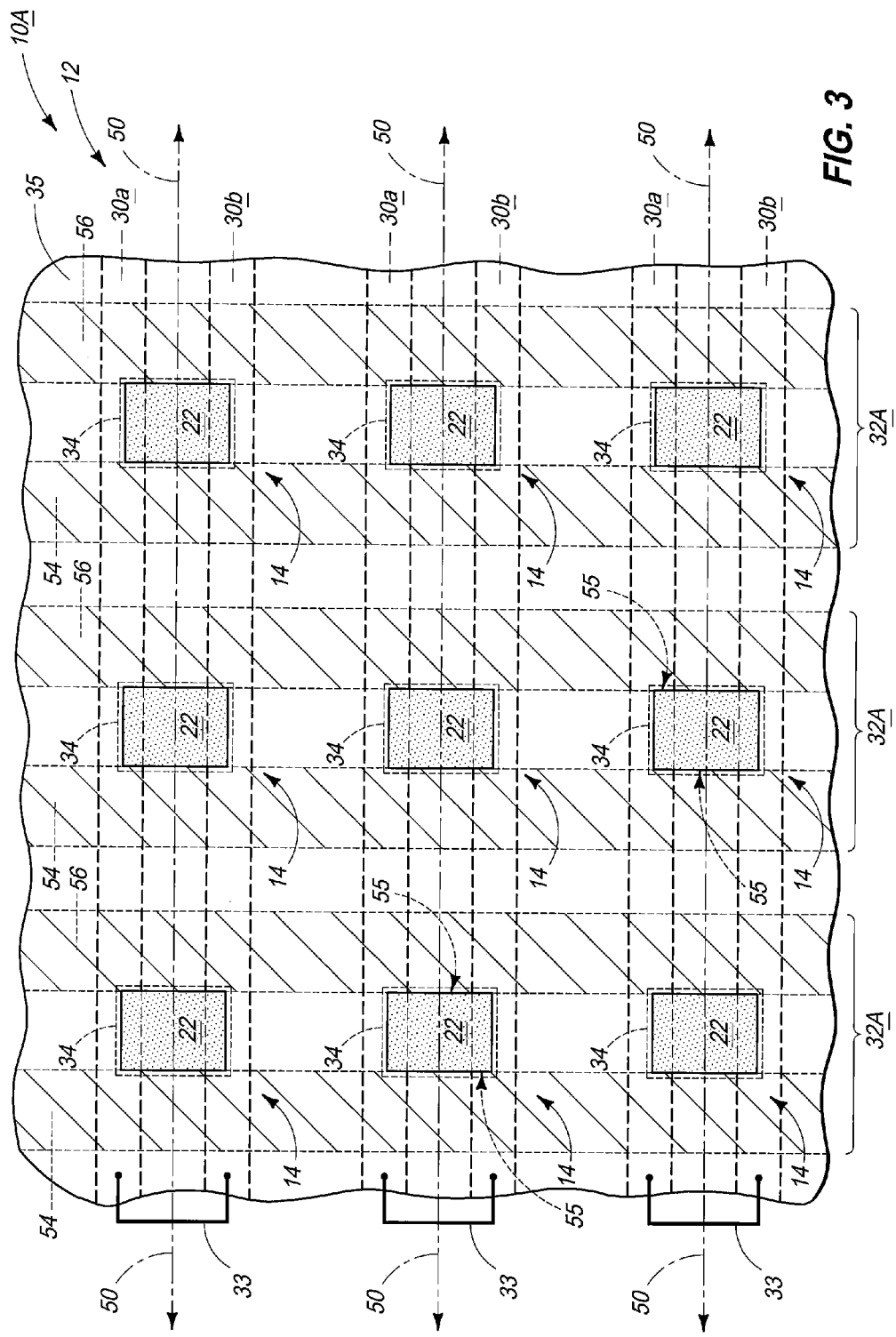
FIG. 3 is a diagrammatic top plan view of an alternate embodiment array of memory cells in accordance with an embodiment of the invention.

FIG. 2 depicts an example embodiment where individual access gate lines 32 are "wrap-around" gate line constructions wherein all lateral sides of a respective channel region 26 are surrounded by gate dielectric 34 and conductive gating material shown by the diagonal hatching. FIG. 3 depicts an alternate example embodiment access gate line 32A of a substrate fragment 10A. Like numerals from the first-described embodiment have been utilized where appropriate, with some construction differences being indicated with suffix "A" or with different numerals. Access gate lines 32A within array circuitry area 12 respectively comprise a pair of electrically coupled access gate lines 54, 56 which are received elevationally outward of the respective pairs of electrically coupled data/sense lines 30a, 30b. One of gate lines 54 or 56 of each pair is operatively received laterally over one of opposing outer lateral sides 55 of channel region 26, with the other of lines 54 or 56 of each pair being operatively laterally over the other of such outer sides 55 of channel region 26. In one embodiment, opposing laterally outer sides 55 of channel region 26 are transversely oriented relative to opposing laterally outer sides 28 of inner source/drain region 24. Lines 54, 56 of each such pair 32A would be electrically coupled to one another (not shown), for example outside of the FIG. 3 view.

Figure 4:
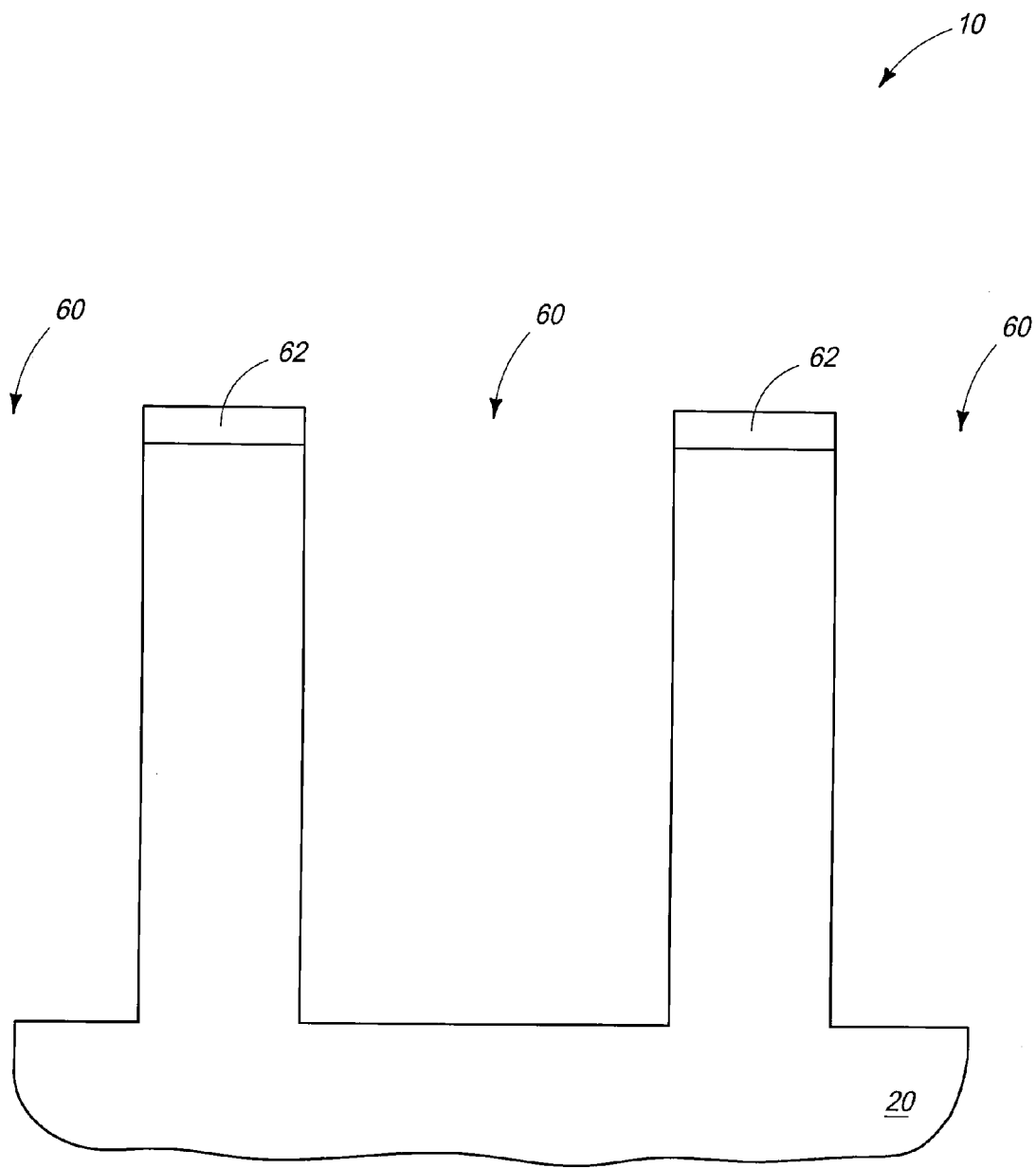
FIG. 4 is a diagrammatic sectional view of a substrate fragment in process in accordance with an embodiment of the invention.

Embodiments of the invention encompass methods of forming memory cells, including methods of forming arrays of memory cells. Example such methods are described initially with reference to FIGS. 4-10 with respect to a substrate fragment 10 in-process. Such example methods may be used to fabricate the arrays of memory cells of FIGS. 1-3, or for fabricating other memory cells and/or arrays of memory cells. Regardless, FIG. 4 depicts substrate fragment 10 of FIG. 2 at an earlier-in-time point of processing thereby not yet including all of the components of substrate fragment 10 of FIG. 1. In one embodiment, substrate material 20 comprises semiconductive material into which trenches 60 have been etched, with any adjacent two such trenches being considered as a pair of trenches. By way of example only, such may be conducted by subtractive etching using a previously-patterned masking material 62 received over semiconductive material 20 as a mask. Masking material 62, by way of example, may comprise photoresist and/or hard masking material.

Figure 5:
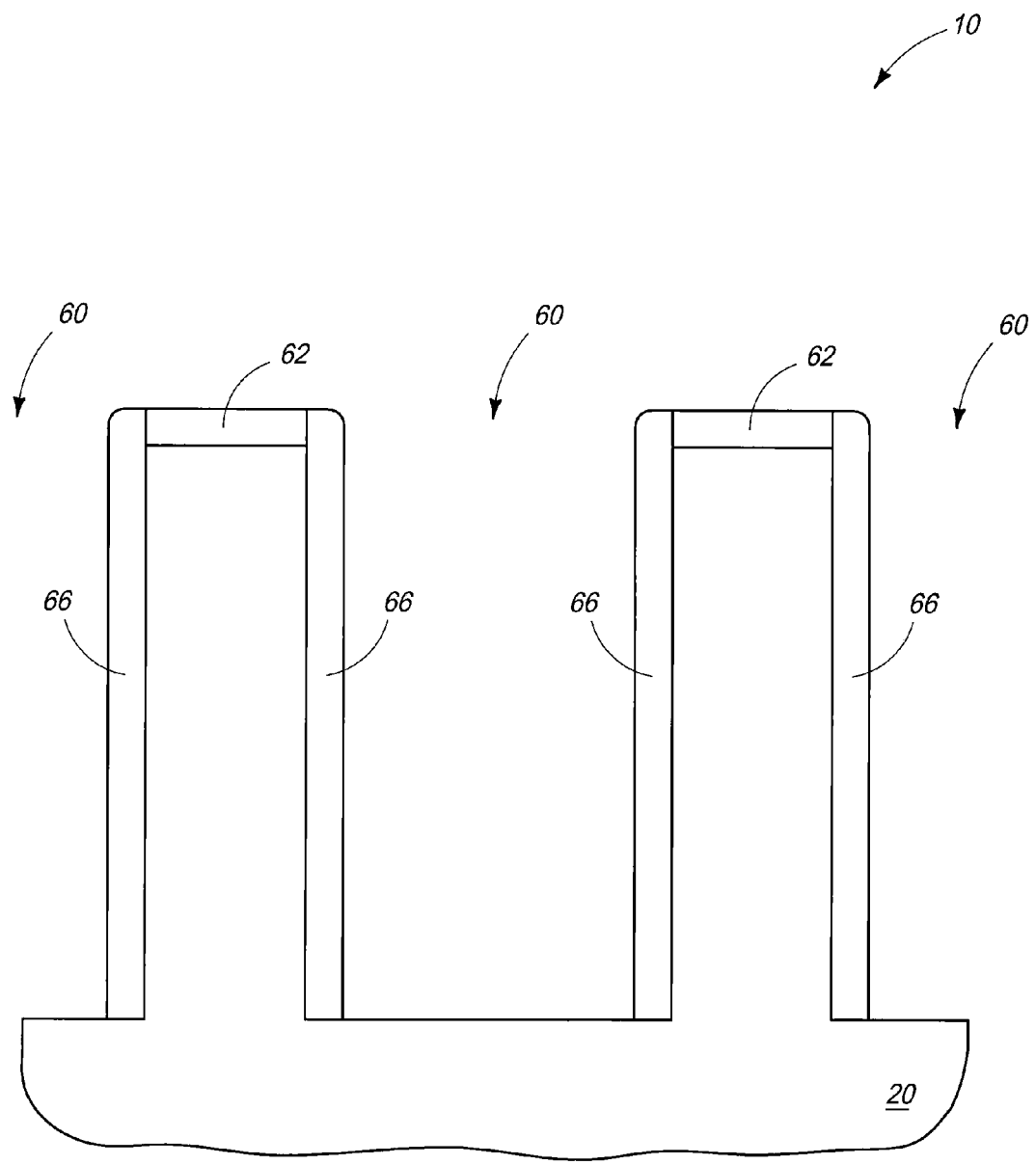
FIG. 5 is a view of the FIG. 4 substrate fragment at a processing step subsequent to that shown by FIG. 4.

Referring to FIG. 5, at least outer portions of sidewalls of trenches 60 have been masked, for example with a masking material 66 which may or may not be sacrificial. Such may be conductive, semiconductive, or dielectric, with silicon nitride being but one example dielectric material. The FIG. 5 construction may be formed by deposition of masking material 66 followed by masked or maskless anisotropic etching thereof to remove such from horizontal surfaces.

Figure 6:
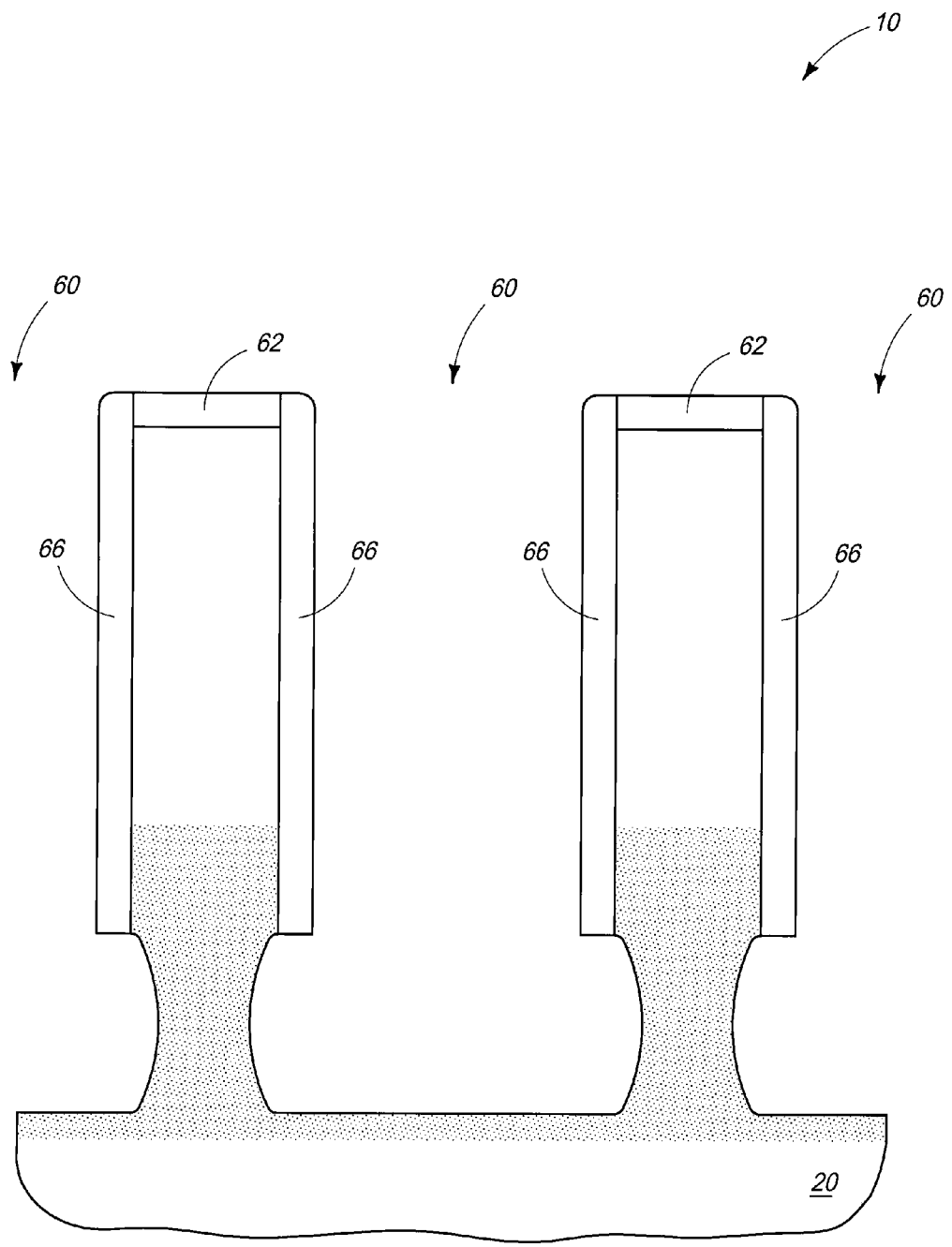
FIG. 6 is a view of the FIG. 5 substrate fragment at a processing step subsequent to that shown by FIG. 5.

Referring to FIG. 6, trenches 60 have been etched deeper into semiconductive material 20 while at least elevationally outer portions of sidewalls of such trenches are masked (for example, by masking material 66). In one embodiment, the trench etching of FIG. 4 may be referred to as a first etching of a pair of trenches, while that of FIG. 6 may be referred to as a second etching of such trenches. In the context of this document, such reference to "first", "second", "third", etc. are temporal only with respect to each and are not necessarily the first, second, etc. ever-such etching of such substrate material and/or trenches. Regardless, the etching of trenches 60 deeper within FIG. 6 is shown as etching semiconductive material 20 laterally as well as elevationally inward. FIG. 6 also depicts semiconductive material 20 as having been conductively doped at bases of trenches 60 and laterally between such trenches. In one embodiment, such occurs while at least the outer portions of the trench sidewalls are masked from such conductively doping, for example by masking material 66, where such comprises plasma and/or gas phase diffusion doping. Such doping may alternately or also be conducted by an ion implanting technique. Regardless, FIGS. 5 and 6 depict an example embodiment wherein such conductively doping of semiconductive material 20 occurs after the second etching of FIG. 6. Alternately, such conductive doping may occur with respect to the substrate of FIG. 5 before the example etching of FIG. 6.

Figure 7:
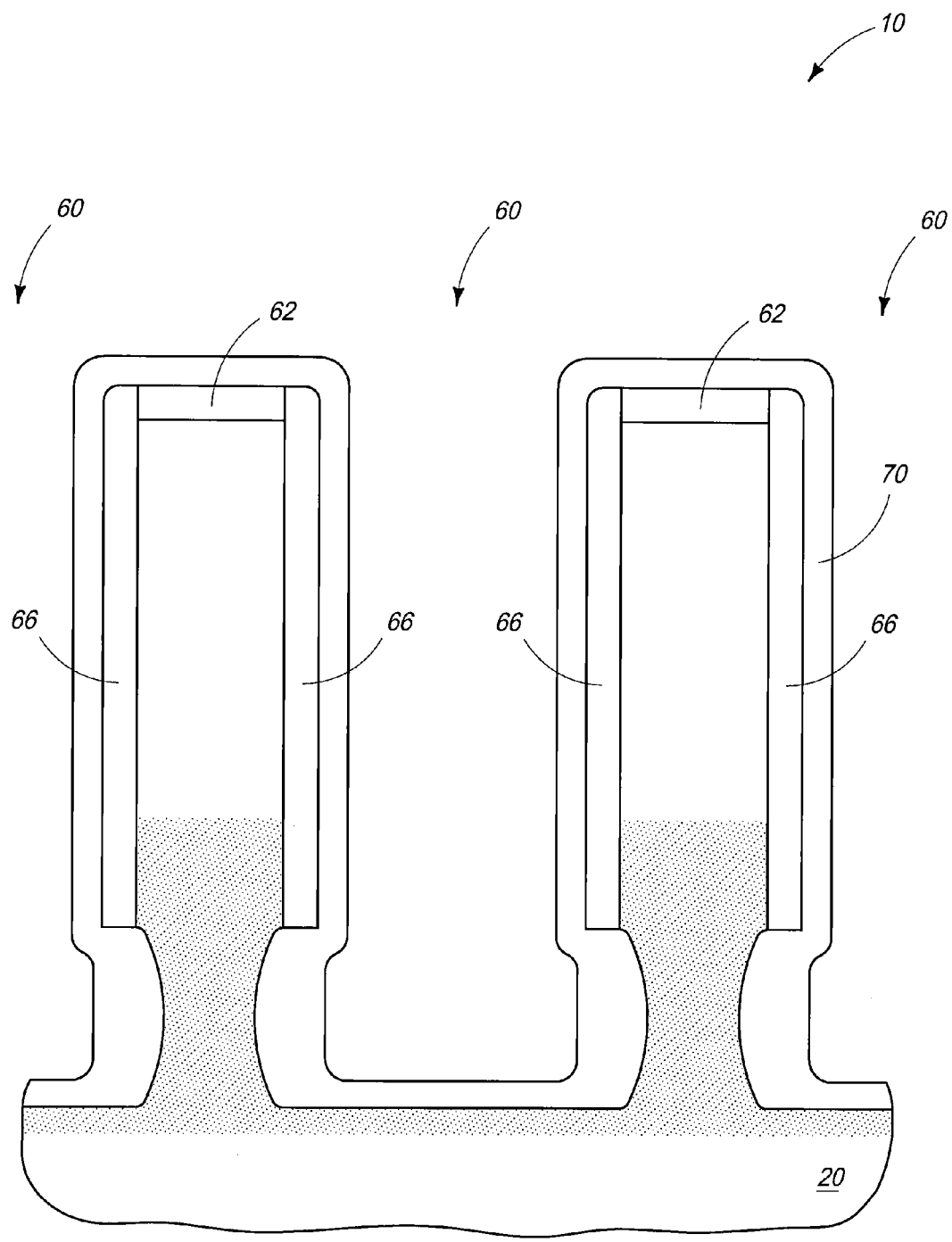
FIG. 7 is a view of the FIG. 6 substrate fragment at a processing step subsequent to that shown by FIG. 6.

Referring to FIG. 7, conductive material 70 has been deposited to line the masked outer portion of the trench sidewalls, to line elevationally inner portions of sidewalls of semiconductive material 20 of the deepened trenches, and to line the bases of the deepened trenches. Conductive material 70 less-than-fills deepened trenches 60. Conductive material 70 may be homogenous or non-homogenous, with example materials being elemental metals, alloys of elemental metals, conductive metal compounds, and/or conductively doped semiconductor material. Titanium nitride is but one example.

Figure 8:
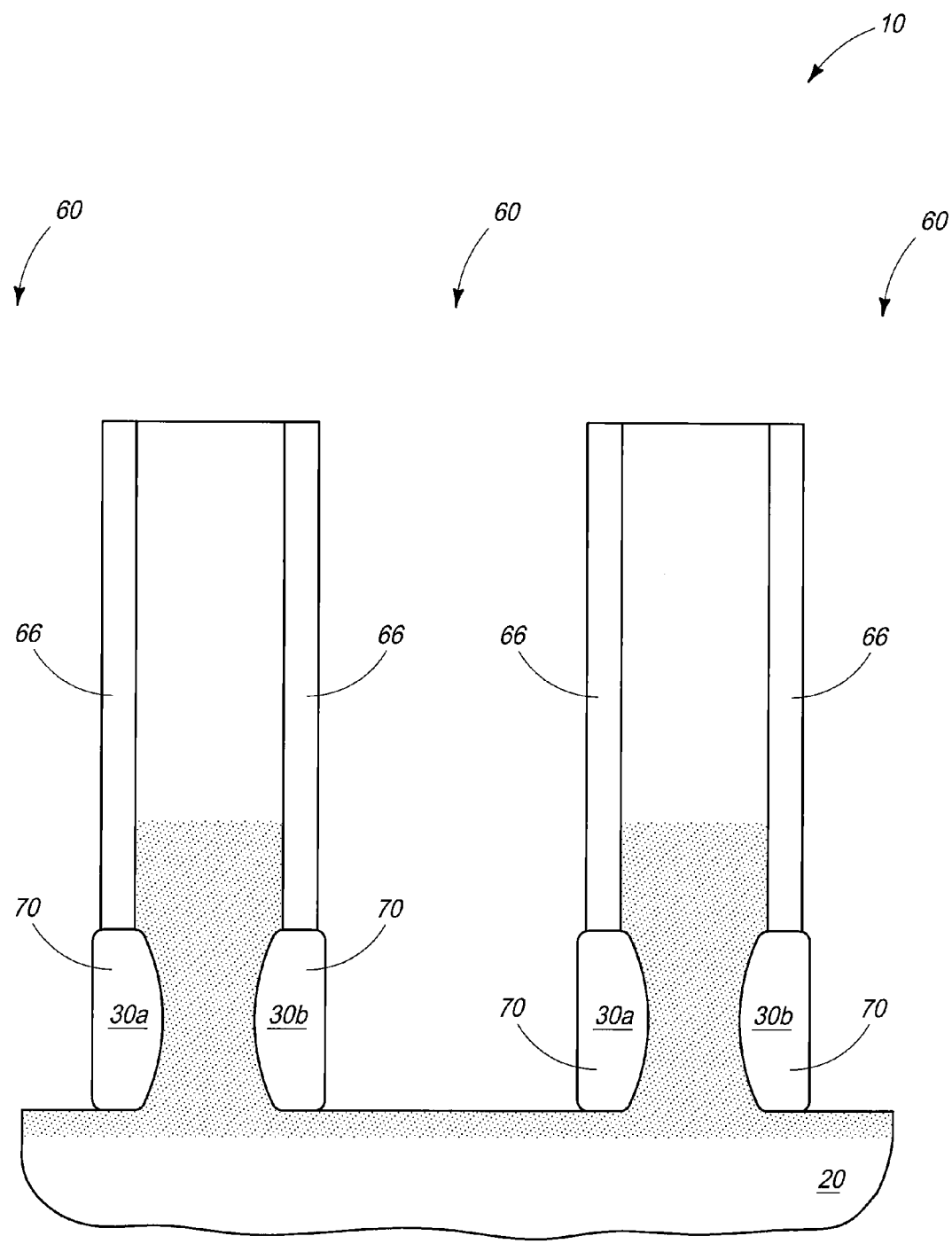
FIG. 8 is a view of the FIG. 7 substrate fragment at a processing step subsequent to that shown by FIG. 7.

Referring to FIG. 8, conductive material 70 has been etched from being received over the masked outer portion of the trench sidewalls and from being centrally received over the deepened trench bases. Such forms pairs of conductive data/sense lines 30a, 30b within the deepened trenches laterally against and electrically coupled to opposing sides of the conductively doped semiconductive material 20 received between deepened trenches 60. In one embodiment, such etching may be conducted in the absence of any photoresist being received anywhere over semiconductive material 20, for example comprising maskless anisotropic etching. Masking material 62 (not shown) has been removed in FIG. 8, and such may be wholly or partially removed earlier, or not at all.

Figure 9:
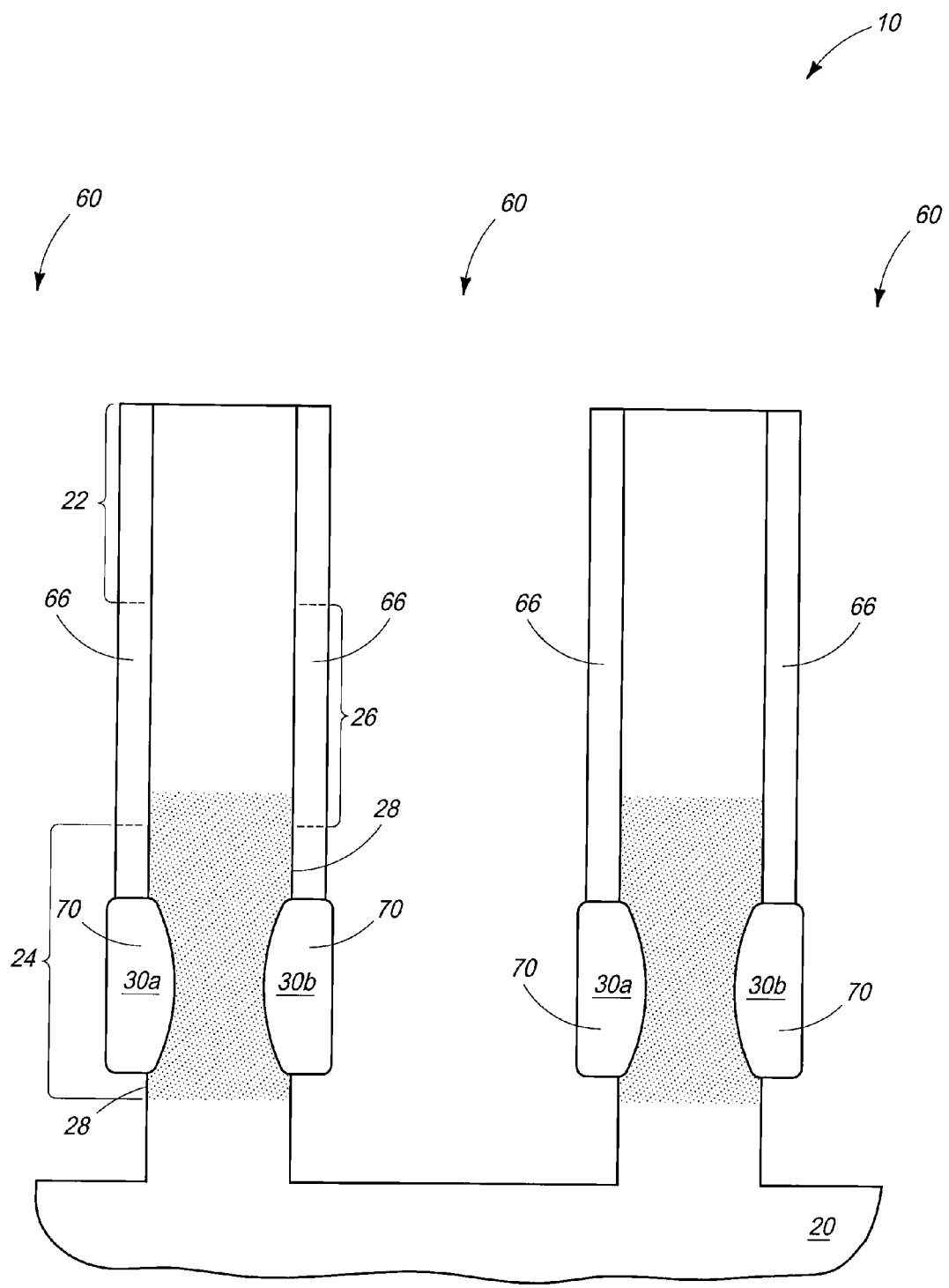
FIG. 9 is a view of the FIG. 8 substrate fragment at a processing step subsequent to that shown by FIG. 8.

Referring to FIG. 9, trenches 60 have been etched deeper into semiconductive material 20 and elevationally through the conductively doped region/portion thereof at the bases of the deepened trenches resulting from the example FIG. 8 etching. Some or all of material 66 may remain or be removed.

The above processing of FIGS. 4-9 provides but one example embodiment of a method of forming a pair of trenches 60 in semiconductive material 20. Semiconductive material 20 between trenches 60 comprises an elevationally inner source/drain portion 24, and elevationally outer source/drain portion 22, and an elevationally mid-channel portion 26 between inner and outer source/drain portions 24, 22, respectively. Some, all, or none of such may be suitably doped with conductivity modifying impurities to finished circuitry concentrations at this point, or may be so provided subsequently. Regardless, in one embodiment, the forming of such trenches may comprise two time-separated etching steps of the semiconductive material, and in one embodiment may comprise three time-separated etching steps of the semiconductive material. In one embodiment, inner source/drain portion 24 of semiconductive material 20 is conductively doped between trenches 60 while the lateral sidewalls of mid-channel portion 26 of semiconductive material 20 between trenches 60 are masked (i.e., FIG. 6), and in one embodiment while the lateral sidewalls of outer source/drain portion 22 are masked.

The above example processing of FIGS. 4-8 is but one example method of forming a pair of conductive data/sense lines 30a, 30b within trenches 60 laterally over and electrically coupled to opposing sides 28 of inner source/drain portion 24 of semiconductive material 20. In one embodiment and as shown in FIG. 9, trenches 60 have been etched to be deeper within semiconductive material 20 after forming the pairs of conductive data/sense lines 30a, 30b.

Figure 10:
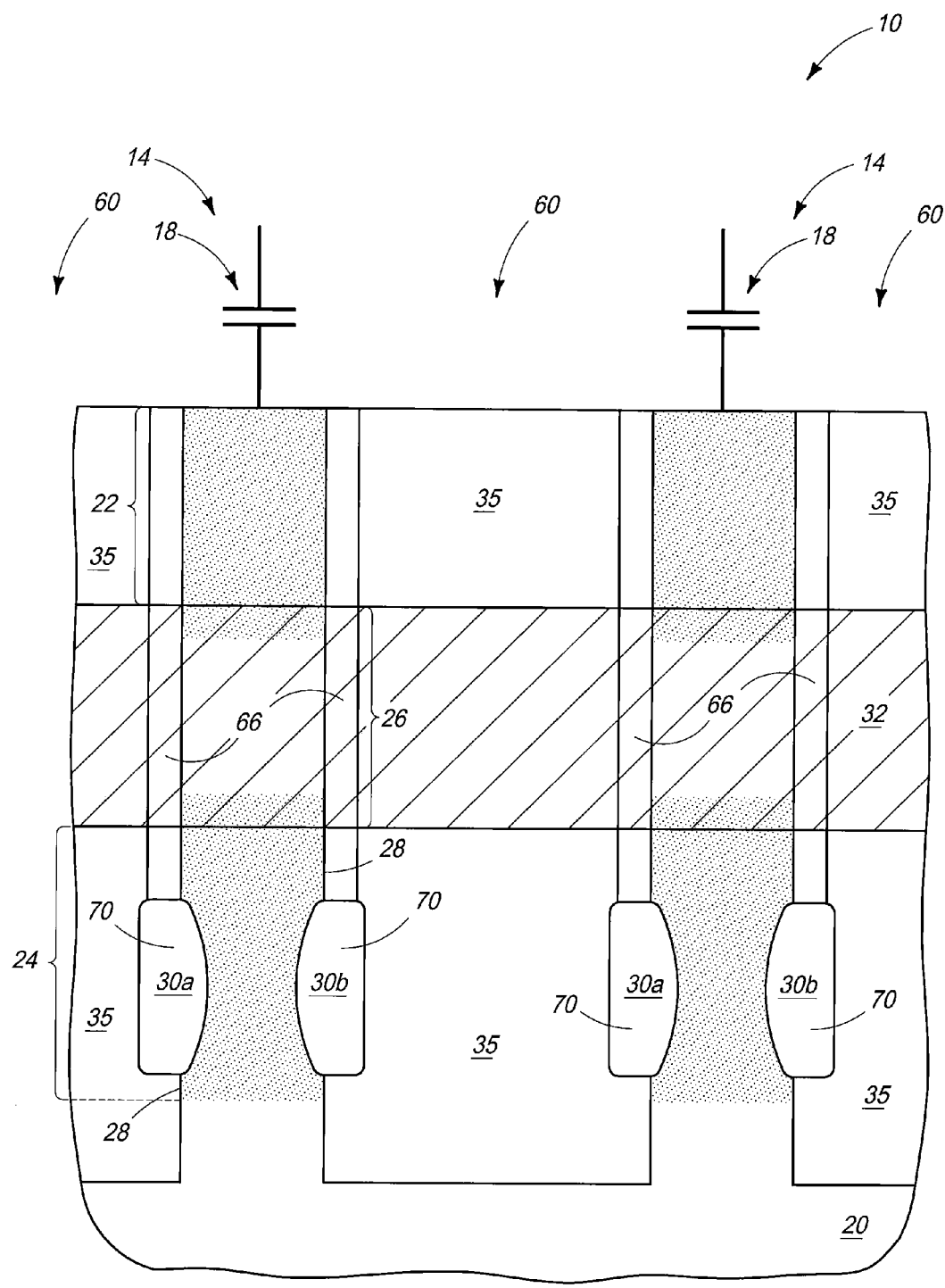
FIG. 10 is a view of the FIG. 9 substrate fragment at a processing step subsequent to that shown by FIG. 9.

Referring to FIG. 10, an access gate line 32 has been formed elevationally outward of and spaced from the pairs of conductive data/sense lines 30a, 30b and laterally adjacent mid-channel portion 26 of semiconductive material 20, and thereby elevationally outward of the conductively doped portion 24 of semiconductive material 20 between trenches 60. A suitable gate dielectric (not shown in FIG. 10) would be provided laterally between access gate line 32 and semiconductive channel portion 26 prior to formation of access gate line 32. By way of example only, such gate dielectric and access gate line may be formed over the depicted planarized lower dielectric material 35. The paired gate line construction of FIG. 3, or some other construction, may alternately be used. A charge storage device 18 is ultimately formed that may electrically couple to a portion of semiconductive material 20 between the trenches elevationally outward of channel portion 26, for example to source/drain portion 22. FIGS. 1 and 10 illustrate the same essential construction except with material 66 (for example if dielectric) being a separate part of dielectric material 35 in FIG. 10.

Figure 11:
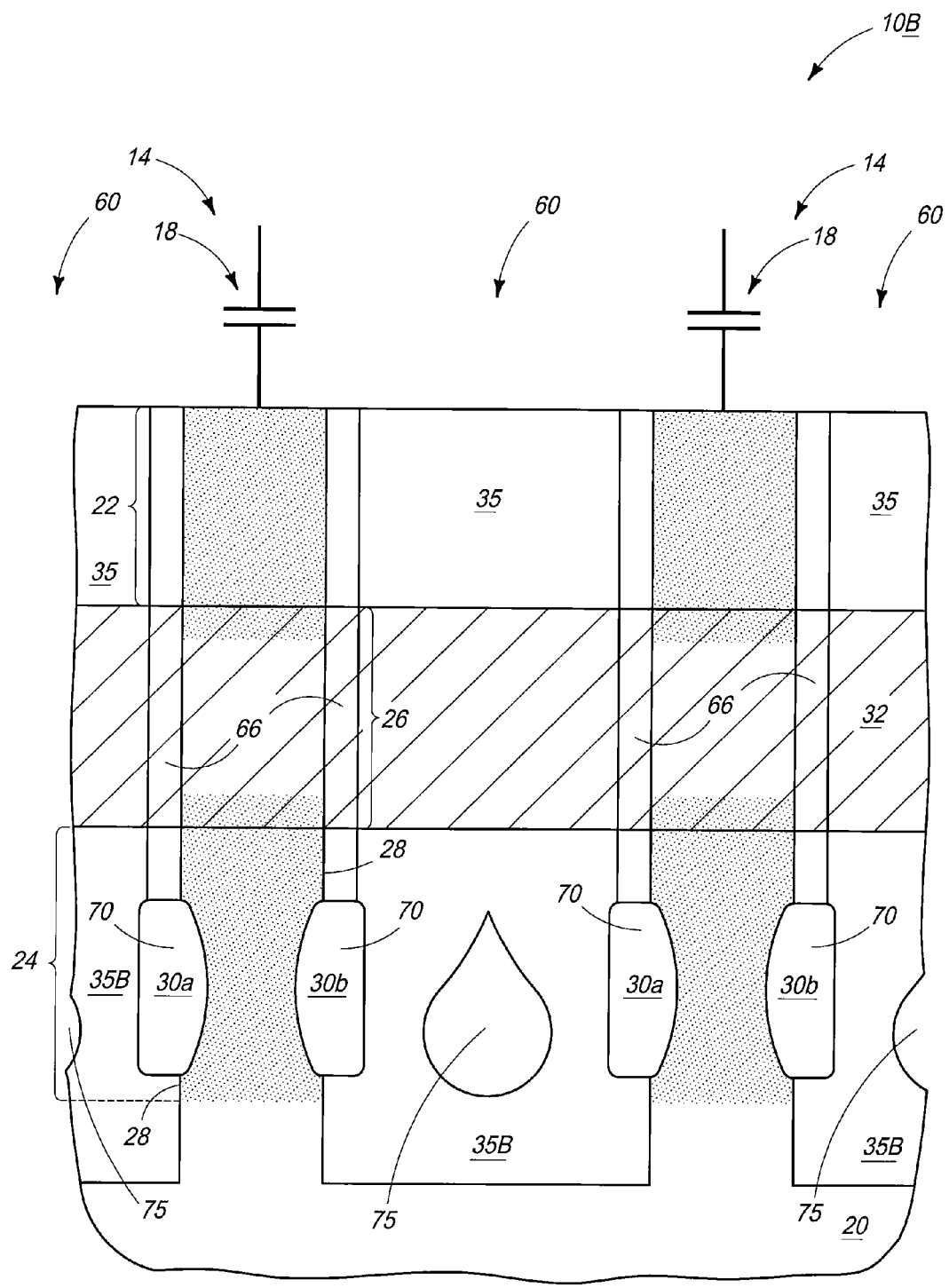
FIG. 11 is a view of the FIG. 9 substrate fragment at a processing step subsequent to that shown by FIG. 9 and alternate to that shown by FIG. 10.

FIG. 11 depicts an alternate example embodiment substrate 10B to that depicted by FIG. 10. Like numerals from the above-described embodiments have been utilized where appropriate, with some construction differences being indicated with the suffix "B" or with different numerals. Trenches 60 within an array of such memory cells may be considered as separating adjacent memory cells, for example immediately adjacent memory cells in different lines 50 (FIG. 2) of memory cells. FIG. 11 depicts an example void space 75 in the finished circuitry construction received laterally between adjacent memory cells 14 within a solid dielectric 35B. Such may be provided, for example, by a less-than-conformal deposition of dielectric material 35B whereby void spaces 75 form. Such void spaces may have higher dielectric constant than surrounding dielectric material 35B, thereby providing better dielectric isolation between immediately adjacent memory cells 14 of adjacent lines 50 (FIG. 2). Access gate lines 32 are ultimately formed over lower solid dielectric 35C having void spaces 75 therein. The paired gate line construction of FIG. 3, or some other construction, may alternately be used.

Figure 12:
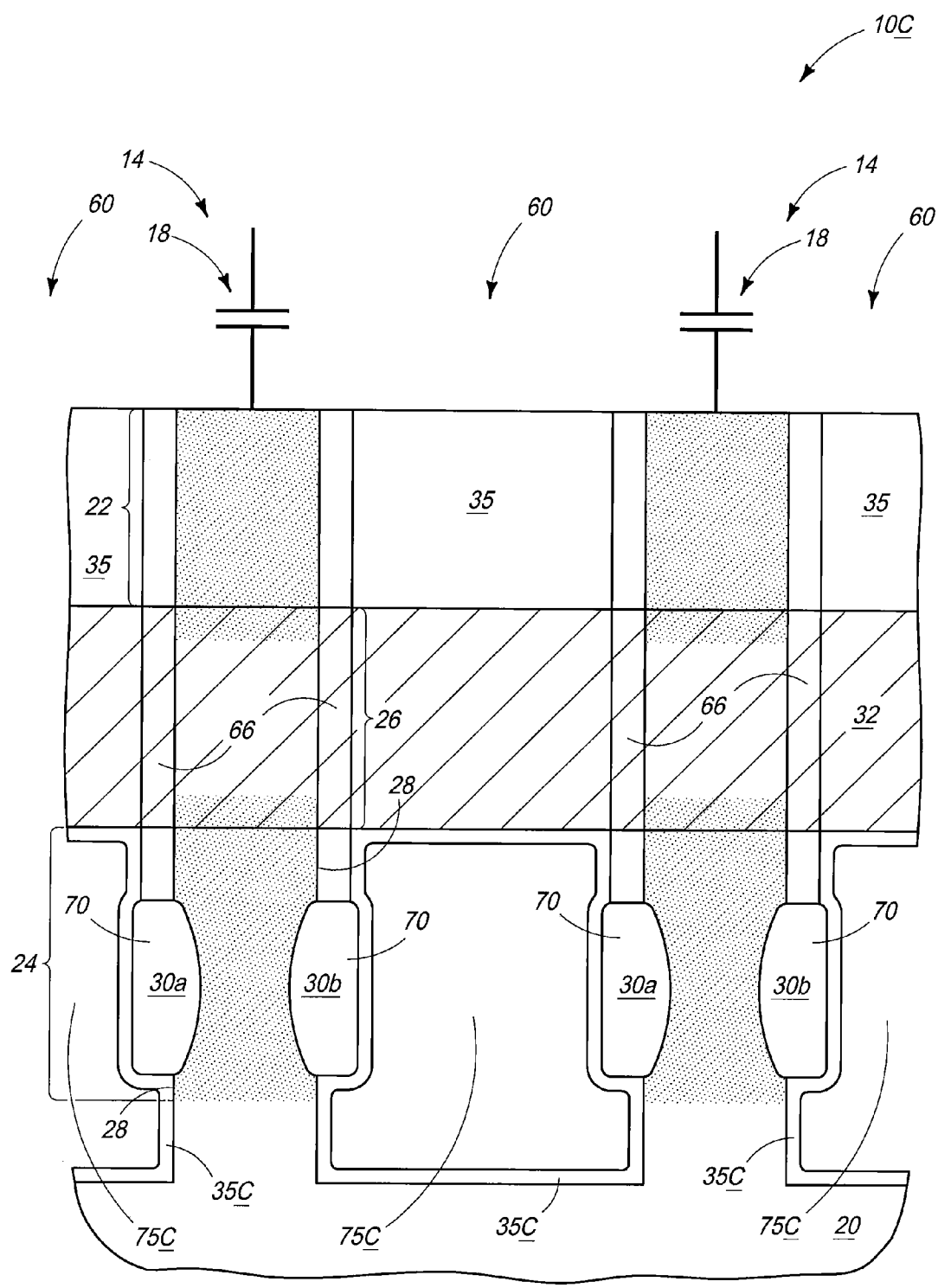
FIG. 12 is a view of the FIG. 9 substrate fragment at a processing step subsequent to that shown by FIG. 9 and alternate to that shown by FIGS. 10 and 11.

An alternate example substrate fragment 10C to that depicted in FIG. 11 is shown in FIG. 12. Like numerals from the above-described embodiments have been utilized where appropriate, with some construction differences being indicated with the suffix "C". FIG. 12 depicts void spaces 75C being considerably larger than that of the example FIG. 11 embodiment. Such by way of example may be formed by depositing a suitable sacrificial material within trenches 60 after forming the pairs of conductive data/sense lines 30a, 30b. For example, the material over which the access gate lines may be formed could be entirely sacrificial and removed eventually by selective etching. Such sacrificial material may be removed from being elevationally inward of such access gate lines, for example whereby the access gate lines are still elevationally supported at their respective opposing longitudinal ends outside of the array circuitry area. Subsequently, dielectric material could be deposited, for example depicted dielectric material 35C, to only partially replace the removed sacrificial material to leave a void space 75C within trenches 60 received laterally between adjacent of the pairs of conductive data/sense lines 30a, 30b.

The above-described methods and structures may be fabricated to any suitable architecture or size. In one example, individual memory cells of the above architecture may have 4F² horizontally occupied area, where "F" is a minimum feature dimension of lithographically-defined features. Regardless, an example lateral width/thickness of individual data/sense lines 30a, 30b is 10 nanometers, with a separation distance between adjacent electrically coupled pairs 30a, 30b within trenches 60 being 20 nanometers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
   a vertically oriented transistor having an elevationally outer source/drain region, an elevationally inner source/drain region, and a channel region elevationally between the inner and outer source/drain regions; the inner source/drain region having opposing laterally outer sides;
   a pair of data/sense lines, one of the pair of data/sense lines being electrically coupled to and against one of the outer sides of the inner source/drain region, the other of the pair of data/sense lines being electrically coupled to and against the other of the outer sides of the inner source/drain region, the data/sense lines of the pair of data/sense lines being electrically coupled to one another through the inner source/drain region, the data/sense lines of the pair of data/sense lines additionally being electrically coupled to one another by an electrically conductive interconnect, each of the pair of data/sense lines projecting laterally into the inner source/drain region and also projecting laterally outward from the inner source/drain region;
   an access gate line elevationally outward of the pair of electrically coupled data/sense lines and which is operatively adjacent the channel region; and
   a charge storage device electrically coupled to the outer source/drain region.

2. The memory cell of claim 1 wherein the data/sense lines have a common elevational thickness.

3. The memory cell of claim 2 wherein the data/sense lines are elevationally coincident relative one another.

4. The memory cell of claim 1 wherein the inner source/drain region is elevationally thicker than at least one of the data/sense lines.

5. The memory cell of claim 4 wherein the inner source/drain region is elevationally thicker than both of the data/sense lines.

6. The memory cell of claim 1 wherein the outer sides of the inner source/drain regions respectively have a curved surface against which the one or other data/sense line is received.

7. The memory cell of claim 6 wherein the curved surface is concave.

8. The memory cell of claim 1 wherein the inner source/drain region extends elevationally inward relative to at least one of the data/sense lines.

9. The memory cell of claim 8 wherein the inner source/drain region includes a portion received elevationally inward of a portion of the at least one data/sense line.

10. The memory cell of claim 8 wherein the inner source/drain region extends elevationally inward relative to each of the data/sense lines.

11. The memory cell of claim 10 wherein the inner source/drain region includes one portion received elevationally inward of a portion of one data/sense line and another portion received elevationally inward of a portion of the other data/sense line.

12. The memory cell of claim 1 wherein the inner source/drain region extends elevationally outward relative to at least one of the data/sense lines.

13. The memory cell of claim 12 wherein the inner source/drain region includes a portion received elevationally outward of a portion of the at least one data sense line.

14. The memory cell of claim 1 wherein the inner source/drain region extends elevationally outward relative to each of the data/sense lines.

15. The memory cell of claim 14 wherein the inner source/drain region includes one portion received elevationally outward of a portion of one data/sense line and another portion received elevationally outward of a portion of the other data/sense line.

16. The memory cell of claim 1 wherein,
   the inner source/drain region extends elevationally inward and outward relative to each of the data/sense lines;
   the inner source/drain region includes a first portion received elevationally inward of a first portion of one data/sense line and a second portion received elevationally inward of a first portion of the other data/sense line; and
   the inner source/drain region includes a third portion received elevationally outward of a second portion of the one data/sense line and a fourth portion received elevationally outward of a second portion of the other data/sense line.

17. The memory cell of claim 1 wherein at least one of the data/sense lines has one outer lateral side which is convex and another outer lateral side which is straight.

18. The memory cell of claim 17 wherein the another outer lateral side is vertically oriented.

19. The memory cell of claim 1 wherein each data/sense line has one outer lateral side which is convex and another outer lateral side which is straight.

20. The memory cell of claim 19 wherein the another outer lateral side is vertically oriented.

21. The memory cell of claim 1 wherein the interconnect comprises metal.

22. The memory cell of claim 1 wherein each of the pair of data/sense lines projects laterally outward from the inner source/drain region a greater distance than projecting laterally into the inner source/drain region.

23. A memory cell, comprising:
   a vertically oriented transistor having an elevationally outer source/drain region, an elevationally inner source/drain region, and a channel region elevationally between the inner and outer source/drain regions; the channel region having opposing laterally outer sides, the inner source/drain region having opposing laterally outer sides that are transversely oriented relative to the channel region laterally outer sides;

a pair of data/sense lines, one of the pair of data/sense lines being electrically coupled to and against one of the outer sides of the inner source/drain region, the other of the pair of data/sense lines being electrically coupled to and against the other of the outer sides of the inner source/drain region, the data/sense lines of the pair of data/sense lines being electrically coupled to one another through the inner source/drain region, the data/sense lines of the pair of data/sense lines additionally being electrically coupled to one another by an electrically conductive interconnect, each of the pair of data/sense lines projecting laterally into the inner source/drain region and also projecting laterally outward from the inner source/drain region;

a pair of electrically coupled access gate lines elevationally outward of the pair of electrically coupled data/sense lines, one of the pair of gate lines being operatively laterally over one of the outer sides of the channel region, the other of the pair of gate lines being operatively laterally over the other of the outer sides of the channel region; and a charge storage device electrically coupled to the outer source/drain region.

24. The memory cell of claim 23 wherein the opposing laterally outer sides of the inner source/drain regions are transversely oriented relative to the opposing laterally outer sides of the channel region.

25. The memory cell of claim 23 wherein the interconnect comprises metal.

26. The memory cell of claim 23 wherein each of the pair of data/sense lines projects laterally outward from the inner source/drain region a greater distance than projecting laterally into the inner source/drain region.

27. An array of memory cells, comprising:
a plurality of memory cells individually comprising:
  a vertically oriented transistor having an elevationally outer source/drain region, an elevationally inner source/drain region, and a channel region elevationally between the inner and outer source/drain regions; the inner source/drain region having opposing laterally outer sides; and
  a charge storage device electrically coupled to the outer source/drain region;
an array of pairs of adjacent data/sense lines, one of the data/sense lines of the individual pairs of data/sense lines being electrically coupled to and against one of the outer sides of the inner source/drain region of individual of the memory cells, the other of the data/sense lines of the individual pairs of data/sense lines being electrically coupled to and against the other of the outer sides of the inner source/drain region of individual of the memory cells, the one and other data/sense lines of the individual pairs of data/sense lines being electrically coupled to one another through the inner source/drain region there-between, the one and other data/sense lines of the individual pairs of data/sense lines additionally being electrically coupled to one another by an electrically conductive interconnect, each of the one and other data/sense lines of the individual pairs of data/sense lines projecting laterally into the inner source/drain region there-between and also projecting laterally outward from the inner source/drain region there-between; and an array of access gate lines elevationally outward of the array of pairs of data/sense lines, the access gate lines being operatively adjacent the channel region of individual of the memory cells.

28. The array of claim 27 wherein the inner source/drain region of individual of the memory cells electrically couple with the inner source/drain regions of other memory cells respectively extending along respective lines running parallel the data/sense lines.

29. The array of claim 27 wherein the inner source/drain region of individual of the memory cells is electrically isolated from the inner source/drain regions of other memory cells respectively extending along respective lines running parallel the data/sense lines.

30. The array of claim 27 wherein the array of access gate lines comprises pairs of adjacent and electrically coupled access gate lines, one of the access gate lines of the individual pairs of access gate lines being operatively laterally over one of the outer sides of the channel region of individual of the memory cells, the other of the access gate lines of the individual pairs of access gate lines being operatively laterally over the other of the outer sides of the channel region of individual of the memory cells.

31. The memory cell of claim 27 wherein the interconnect comprises metal.

32. The memory cell of claim 27 wherein the interconnect is within the array.

33. The memory cell of claim 27 wherein the interconnect is located peripheral to the array.

34. The memory cell of claim 33 wherein the interconnect is located at longitudinal ends of the one and other data/sense lines of the individual pairs of data/sense lines.

35. The memory cell of claim 33 wherein the interconnect is located adjacent longitudinal ends of the one and other data/sense lines of the individual pairs of data/sense lines.

36. The memory cell of claim 27 wherein each of the one and other data/sense lines of the individual pairs of data/sense lines projects laterally outward from the inner source/drain region there-between a greater distance than projecting laterally into the inner source/drain region there-between.

37. An array of memory cells, comprising:
a plurality of memory cells individually comprising:
  a vertically oriented transistor having an elevationally outer source/drain region, an elevationally inner source/drain region, and a channel region elevationally between the inner and outer source/drain regions; the inner source/drain region having opposing laterally outer sides; and
  a charge storage device electrically coupled to the outer source/drain region;
an array of pairs of adjacent and electrically coupled data/sense lines, one of the data/sense lines of the individual pairs of data/sense lines being electrically coupled to and against one of the outer sides of the inner source/drain region of individual of the memory cells, the other of the data/sense lines of the individual pairs of data/sense lines being electrically coupled to and against the other of the outer sides of the inner source/drain region of individual of the memory cells, adjacent pairs of the data/sense lines being laterally separated by solid dielectric and a void space, the void space extending laterally to be under each of the data/sense lines of the individual pairs of data/sense lines; and
an array of access gate lines elevationally outward of the array of pairs of data/sense lines, the access gate lines being operatively adjacent the channel region of individual of the memory cells.

38. The memory cell of claim 37 wherein the void space does not extend laterally to be elevationally over each of the data/sense lines of the individual pairs of data/sense lines.

* * * * *